(12) United States Patent
Ziesler et al.

(10) Patent No.: US 6,777,992 B2
(45) Date of Patent: Aug. 17, 2004

(54) LOW-POWER CMOS FLIP-FLOP

(75) Inventors: Conrad H. Ziesler, Whitmore Lake, MI (US); Marios C. Papaefthymiou, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/406,366

(22) Filed: Apr. 3, 2003

(65) Prior Publication Data

US 2003/0189451 A1 Oct. 9, 2003

Related U.S. Application Data

(60) Provisional application No. 60/370,120, filed on Apr. 4, 2002.

(51) Int. Cl.[7] .......................... H03K 3/356; H03K 3/037
(52) U.S. Cl. ...................... 327/208; 327/210; 327/218
(58) Field of Search ................................ 327/199, 200, 327/201, 208–213, 218

(56) References Cited

U.S. PATENT DOCUMENTS

| | | | |
|---|---|---|---|
| 5,023,480 A | 6/1991 | Gieseke et al. | 326/119 |
| 5,036,217 A | 7/1991 | Rollins et al. | 327/203 |
| 5,146,109 A * | 9/1992 | Martignoni et al. | 327/108 |
| 5,311,071 A | 5/1994 | Ueda | 327/63 |
| 5,384,493 A | 1/1995 | Furuki | 327/203 |
| 5,473,526 A | 12/1995 | Svensson et al. | 363/60 |
| 5,506,520 A | 4/1996 | Frank et al. | 326/96 |
| 5,517,145 A | 5/1996 | Frank | 327/201 |
| 5,526,319 A | 6/1996 | Dennard et al. | 365/226 |
| 5,559,478 A | 9/1996 | Athas et al. | 331/17 FE |
| 5,587,676 A * | 12/1996 | Chowdhury | 327/108 |
| 5,734,285 A | 3/1998 | Harvey | 327/291 |
| 5,838,203 A | 11/1998 | Stamoulis et al. | 336/1 A |
| 6,037,816 A * | 3/2000 | Yamauchi | 327/213 |
| 6,069,495 A | 5/2000 | Ciccone et al. | 326/98 |
| 6,278,308 B1 | 8/2001 | Partovi et al. | 327/218 |
| RE37,552 E | 2/2002 | Svensson et al. | 363/60 |
| 6,563,362 B2 | 5/2003 | Lambert | 327/333 |
| 6,608,512 B2 * | 8/2003 | Ta et al. | 327/211 |

OTHER PUBLICATIONS

Low–Power Digital Systems Based on Adiabatic–Switching Principles by William C. Athas, Lars "J." Svensson, Member IEEE, Jeffrey G. Koller, Nestoras Tzartzanis, and Eric Ying–Chin Chou, Student Member, IEEE in the IEEE Transaction On Very Large Scale Integration (VLSI) Systems, vol. 2, No. 4, Dec. 1994.

A Resonant Clock Generator for Single–Phase Adiabatic Systems by Conrad H. Ziesler, Suhwan Kim and Marios C. Papaefthymiou. P)ublished ISLPED '01, Aug. 6–7, 2001.

Energy Recovering Static Memory by Joohee Kim, Conrad H. Ziesler & Marios C. Papaefthymiou. Published ISLPED '02, Aug. 12–14, 2002.

PCT International Search Report dated Sep. 29, 2003—PCT/US03/10320.

* cited by examiner

Primary Examiner—Tuan T. Lam
(74) Attorney, Agent, or Firm—Rader, Fishman & Grauer PLLC

(57) ABSTRACT

A flip-flop includes a charge storage area that stores a logic voltage indicating a logic state of the flip-flop, a first transistor having a source or drain connected to a clock signal generating circuit, a second transistor having a source or drain connected to the clock signal generating circuit, a clock signal generated by the clock signal generating circuit that is ramped or sinusoidal, and a latching circuit that latches a latch voltage value based on voltages at the first transistor and the second transistor. The charge storage area supplies a first voltage representing a state of the storage voltage to a gate of the first transistor and supplies a second voltage to a gate of the second transistor.

24 Claims, 3 Drawing Sheets

LOW-POWER CMOS FLIP-FLOP

REFERENCE TO RELATED APPLICATIONS

This application claims priority based on U.S. Provisional Patent Application No. 60/370,120, filed Apr. 4, 2002, the entirety of which is incorporated herein by reference.

This invention was made with government support under Grant #DAAD19-99-1-0304 and Grant #DAAG55-97-1-0250 from U.S. Department of the Army. The government has certain rights in the invention.

FIELD OF THE INVENTION

The present invention generally relates to a flip-flop for a computing device, and more particularly, the present invention relates to a flip-flop for a computing device that utilizes energy recovery to reduce power consumption.

BACKGROUND OF THE INVENTION

Conventional computing systems utilize a plurality of flip-flops in conjunction with a clock signal generating circuit. The flip-flops store binary states, such as 1's and 0's contingent on the absence or presence of a voltage or charge in the flip-flop. The binary states, read or written in the flip-flops, are then used for combinational boolean logic for operation and calculation procedures in the computing system. When writing a logic state in the flip flop by a device external to the flip flop is desired, an oscillating voltage or clock signal operates the flip fop to cause a voltage value representative of the stored state to be stored to be written to the latching circuit in the flip-flop, latch the voltage value and hold it available for reading devices external to the flip-flop. The clock signal is commonly a square wave that drives a gate of a transistor of the flip-flop. A clock signal generating circuit, external to the flip-flops, generates the signal to effectuate read, write and timing processes in the computing device. The square or abrupt signal drives the gates of transistors in the flip-flop to turn them on and off in a relatively quick manner.

While this structure effectively allows a computing system to effectuate reading of stored logic states contained within the flip-flops, drawback exists. Specifically, only a portion of a computing system's flip-flops are actually read during any given read request. The remainder, however, still receive the clock signal. Commonly, the energy of the clock signal driving the unread flip-flops is dissipated therein, thereby creating energy inefficiencies and increased heat dissipation. When this dissipation effect is multiplied with the numerous flip-flops contained within a computing device, the overall efficiency of that computing device is compromised. The present invention was developed in light of these and other drawbacks.

SUMMARY OF THE INVENTION

A flip-flop includes a charge storage area that stores a logic voltage indicating a logic state of the flip-flop, a first transistor having a source or drain connected to a clock signal generating circuit, a second transistor having a source or drain connected to the clock signal generating circuit, a clock signal generated by the clock signal generating circuit that is ramped or sinusoidal, and a latching circuit that latches a latch voltage value based on voltages at the first transistor and the second transistor. The charge storage area supplies a first voltage representing a state of the storage voltage to a gate of the first transistor and supplies a second voltage to a gate of the second transistor.

Other aspects of the invention will be apparent to those skilled in the art after reviewing the drawings and the detailed description below.

BRIEF DESCRIPTION OF THE DRAWINGS

The present invention will now be described, by way of example, with reference to the accompanying drawings, in which.

DETAILED DESCRIPTION OF THE EMBODIMENTS

It is to be understood that the present invention may be embodied in other specific forms without departing from its essential characteristics. The illustrated and described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

Figure 1:
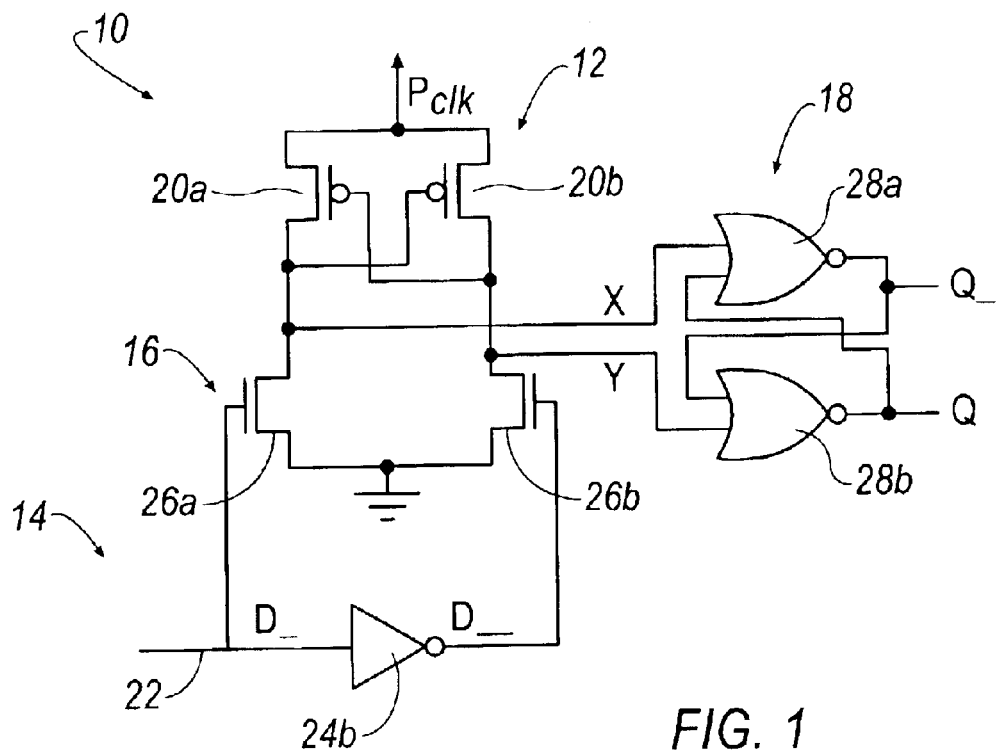
FIG. 1 is a schematic view of a flip-flop according to an embodiment of the invention.

Referring now to FIG. 1, the present invention is shown and described. In FIG. 1, a flip-flop 10 includes clock signal receiving circuit 12, input value 14, reading element 16, and latching element 18. In an embodiment of the invention, clock signal receiving circuit 12 includes two cross-coupled PMOS transistors 20a and 20b. Input value 14 includes a binary value 22, which by absence or presence of a voltage "1" or "0" indicates a Boolean state. Inverter 24b provides an inverted version of binary value 22 to opposite sides of flip-flop 10. An additional inverter can also be added between the inverter 24b and the binary value 22 to, again, invert the binary value supplied to opposite sides of flip-flop 10.

Reading element 16 includes NMOS transistors 26a and 26b that cooperate with input value 14 and inverter 24b to allow binary value 22 to be read in response to a clock signal. Finally, latching element 18 includes cross-coupled NOR gates 28A and 28B to latch binary value 22 and allow it to be read by an external device.

With continued reference to FIG. 1, the operation of the present invention will be shown and described. In operation, clock signal receiving circuit 12 is driven by a preferably sinusoidal or other ramped signal Pclk such as a blip clock or other angled wave form. Pclk preferably drives the source of the PMOS transistors 20a and 20b, and not the gates. As the gates of PMOS transistors 20a and 20b are low, these elements allow the clock signal to pass therethrough. The sinusoidal clock signal assists in ensuring that the energy is not dissipated in the transistors, and is instead passed across the transistors. During both high clock values during read operations and during charge recycling, as will be discussed in greater detail, the sinusoidal signal reduces energy loss by limiting the amount of energy dissipated in the element. Of course, other slower ramped signals may be used instead of a sinusoidal clock signal, such as saw tooth or other angled waves, and the present invention is not limited to sinusoidal waves.

Binary value 22 is inverted by inverter 24b. This inversion process provides opposite charges to different sides of flip-flop 10. As such, when reading of the state of binary value 22 is effectuated, inverter 24b ensures that one NMOS transistor of transistors 26a and 26b conducts while the other does not. By way of a non-limiting example, if binary value 22 is stored as a zero voltage, then a zero voltage to the gate of NMOS transistor 26a while inverter 24b inverts the inverted voltage to supply a voltage to the gate of NMOS transistor 26b. Accordingly, NMOS transistor 26b conducts while NMOS transistor 26a does not conduct. Accordingly, terminal X is not grounded and therefore is at a Pclk voltage while terminal Y is grounded through NMOS transistor 26b and therefore is at ground potential.

Latching element 18 uses cross-coupled NOR gates 28A and 28B as a set/reset latch to latch these opposite and inverted potentials to output them as Q_ and Q respectively. The high potential of X maintains PMOS transistor 20b in an OFF state while PMOS transistor 20a is allowed to conduct by virtue of low potential of terminal Y. Accordingly, while binary value 22 maintains its current logic state, the charge on terminal X is allowed to oscillate back and forth across PMOS transistor 20a with an external inductor or other energy oscillating circuit in an energy recovering state.

As such, based on the above non-limiting example, the operation of flip-flop 10 begins with the data input binary value 22 changing at a suitable time before the rising edge of Pclk. Inverter 24b derives the complemented input, which is applied to the gate of NMOS transistors 26a and 26b. When the rising edge of the sinusoidal Pclk arrives, the cross-coupled PMOS transistors 20a and 20b sense and latch the appropriate value of binary value 22 onto the nodes X and Y. The cross-coupled NOR gates 28A and 28B form a set/reset latch. Therefore, positive pulses on either node X or Y will cause this latch to set or reset, respectively.

When binary value 22 does not change and remains the same, either node X or Y will remain low, with the other node oscillating in phase of Pclk in an energy recovering manner. Specifically, in the example of FIG. 1, node Y remains low while node X oscillates between a high and low state. This is accomplished by transferring charge from the node X across PMOS transistor 20a and back to the oscillating circuit external to the flip-flip 10. This is in contrast to conventional flip-flops which dissipate the unused clock signal in the flip-flop as heat. This feature allows the flip-flop 10 to operate in an energy efficient manner, contrary to devices which merely absorb the stored charge on the respective terminal during each clock cycle, an overall improvement of efficiency and thermal dissipation is achieved.

When binary value 22 does change state, the above-described operation acts to reset the latching element 18. Specifically, in the example of FIG. 1, when the logic state of binary value 22 changes, the inverted charge to the gate of NMOS transistor 26a causes it to conduct while transistor 26b remains OFF. When Pclk goes high, node Y also goes high, while node X goes low. This causes latching element 18 to switch the charge between Q_ and Q and reset the latching element 18. However, once again, the charge Y is not dissipated in the flip-flop and instead is ultimately recycled back through PMOS transistor 20b to the external clock structure.

In a most preferred embodiment, the external clock structure, external to the flip-flop, generates a sinusoidal clock wave to achieve maximum efficiency in the flip-flop 10. However, it is understood that other ramp clock signals may be used such as a blip clock, saw tooth configuration, or any other clock signal having a ramp increase and decrease. It is also understood that by external, the clock structure is outside the flip-flop. It may, however, be on-chip or off-chip with the flip-flop.

Figure 2:
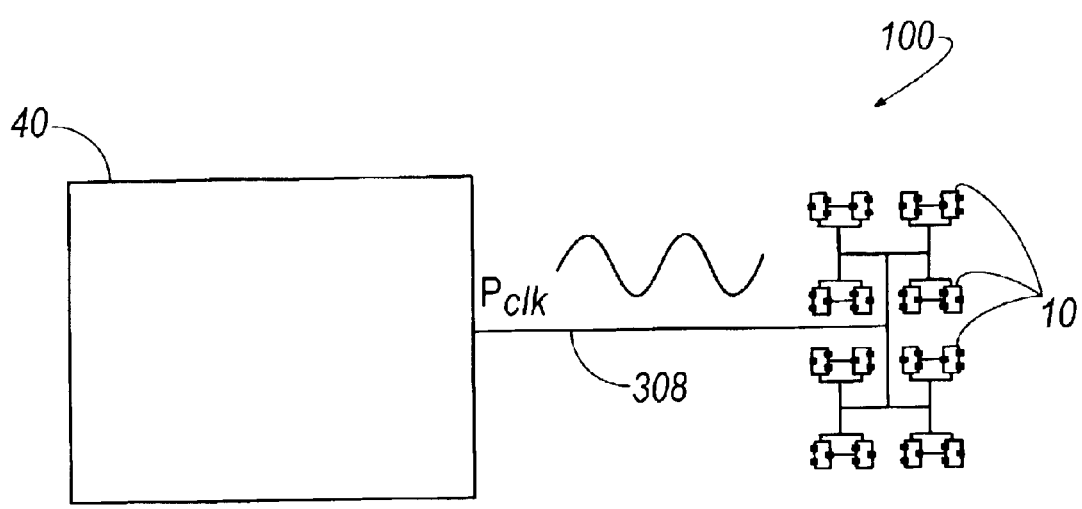
FIG. 2 is a schematic view of a flip-flop and clock generator according to an embodiment of the invention.

Referring now to FIG. 2, a clock tree 100 is shown including a plurality of flip-flops 10. Here, clock signal generator 40 generates a sinusoidal clock wave Pclk that is transmitted to and received from the clock tree 100. In a non-limiting example of an embodiment of the invention, in a 0.25 micrometer process, the clock tree 100 operates in a frequency range between 200 and 500 MHz. When the binary value 22 is not switching, energy consumption per cycle is under 5 fJ at 200 MHz and under 25 fJ at 500 MHz with a switching activity of 0.25, per cycle energy consumption is under 40 fj at 200 MHz and 90 fj at 500 MHz.

Figure 3:
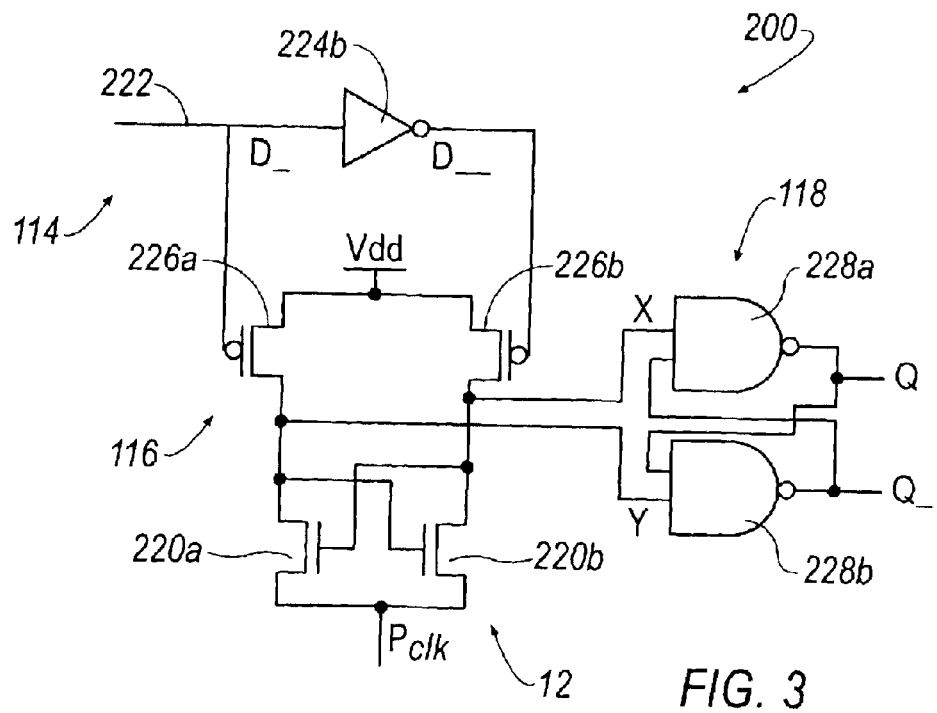
FIG. 3 is a schematic view of a flip-flop according to an embodiment of the invention.

With reference to FIG. 3, a second embodiment of the present invention is shown and described. In FIG. 3, flip-flop 200 is shown having a different configuration from that of FIG. 1. Specifically, inverter 224b of input value 222 connects to gates 226a and 226b of reading element 116. Pclk drives NMOS transistors 220a and 220b of clock signal receiving circuit 12. Latching element 118 includes cross coupled NAND gates 228A and 228B instead of the NOR gates of FIG. 1. Voltage supply Vdd provides a voltage to the source of PMOS transistors 226a and 226b.

With continued reference to FIG. 3, the operation of the present invention is shown and described. In FIG. 3, reading element 116 senses the logic state of binary value 222 and latches it with the cross-coupled NAND gates 228A and 228B of latching element 118. As before, one terminal X or Y remains high while the other terminal oscillates in conjunction with the sinusoidal Pclk signal from an external clock signal generator. Accordingly, as before, the high-charge in either X or Y is recycled back through a respective NMOS transistor 220a or 220b and back to the clock signal generating circuit. Therefore, the overall efficiency of the flip-flop is enhanced.

It should be noted that the sinusoidal or ramped clock signal, provided to the flip flop of the present embodiment, provides energy recovering aspects. Driving both flip-flops 10 and 200 with the clock signal at their sources or drains allows the circuits to operate in their energy recovering state. Specifically, the sinusoidal clock signal driving flip-flops 10 and 200 not only provide timing information, but also provide the voltage required to set and latch the respective logic states in the latching elements 18 and 118 respectively. By driving transistors at their sources or drains as does FIGS. 1 and 3, the present invention uses the clock signal not only for the timing information, but also for operating voltage to read logic states. Accordingly, this energy is able to be recycled back through their respective transistors and to the clock signal generating circuit.

Figure 4:
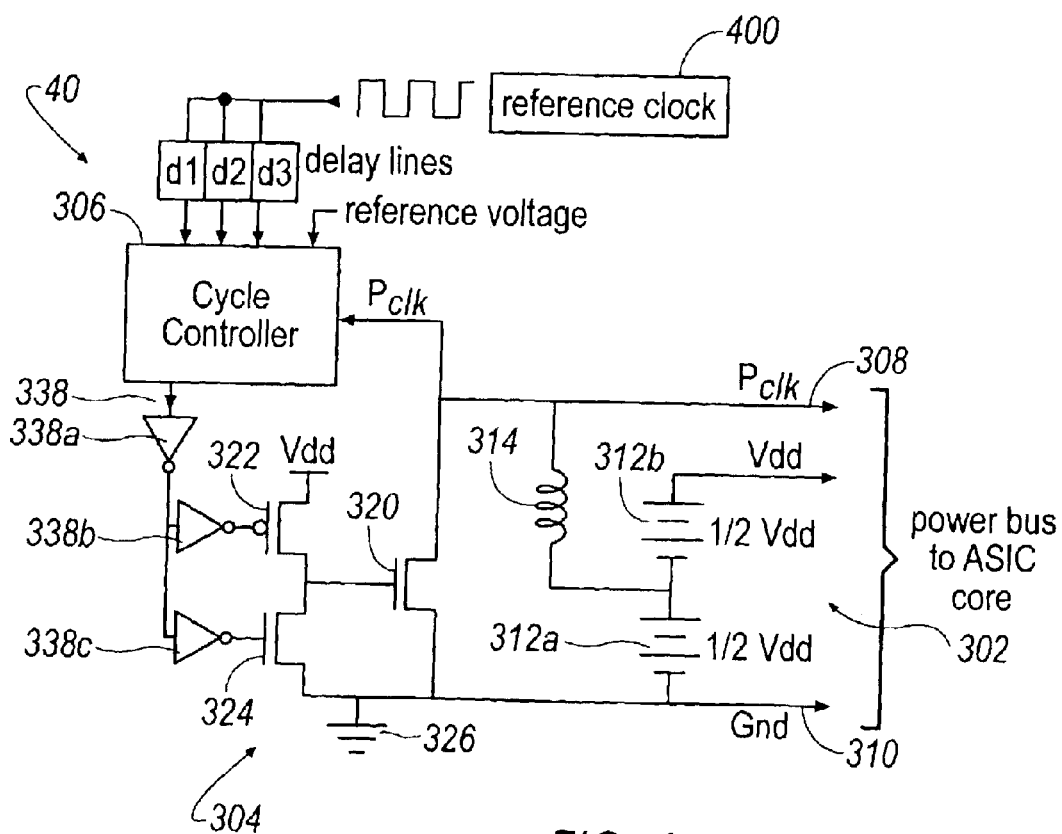
FIG. 4 is a schematic view of a clock generator circuit according to an embodiment of the invention.

Referring now to FIG. 4, clock signal generator 40 is shown and described. The clock signal generator according to the present invention provides a clock signal other than an abrupt square wave to allow the energy to be passed through respective transistors, instead of being absorbed by the transistors. Additionally, the clock signal generator 40 also preferably includes features to allow recycling of the clock signal as well as components that monitor when additional energy needs to be added to the recycling system.

Accordingly, clock signal generator 40 according to an embodiment of the invention includes oscillator portion 302, switch portion 304, cycle controller 306, and reference clock 400. Oscillator portion 302 provides the oscillating recovery features of the preferred system by allowing read voltage from the flip-flops to be recycled. Clock signal generator 40 includes Pclk output node 308 and ground connection 310. Further, oscillator portion 302 includes voltage sources 312A and 312B and inductor 314. As can be seen with reference to FIG. 2, Pclk output node 308, in conjunction with ground connection 310, provides the sinusoidal clock signal to the flip-flops 10.

Reference clock 400 provides a reference clock signal to delay lines d1, d2 and d3, which will be described in greater detail. Switching portion 304 includes main transistor 320 and secondary transistors 322 and 324. Switching portion 304 provides the additional energy needed when the oscillator portion 302 is depleted of energy. To accomplish this function, an embodiment includes main transistor 320 which connects a voltage source at the cycle controller 306 with ground connection 326. Secondary transistors 322 and 324 are PMOS and NMOS transistors, respectively, which connect a voltage source Vdd with ground connection 326. Secondary transistors 322 and 324 are connected to cycle controller 306 through a plurality of invertors 338A, 338B and 338C.

In operation, oscillator portion 302 creates a driven oscillator circuit with the parasitic capacitance of each of the flip-flops 10. As such, the inductor 314 stores energy which is transferred back and forth from the flip-flop 10 and inductor 314. When the read charge sent to the flip-flops 10 by the clock signal generator is recycled, it is recycled back to the inductor 314. Cycle controller 306 monitors the voltage peak level of Pclk and determines when Pclk needs to be replenished. When the cycle controller 306 determines Pclk must be replenished, then cycle controller 306 switches secondary transistor 322 ON and secondary transistor 324 OFF. Therefore, the gate voltage of main transistor 320 is switched ON to provide current flow from cycle controller 306, through main transistor 320 and to ground connection 326. Accordingly, the inductor 314 in parallel with main transistor 314 is replenished.

Figure 5:
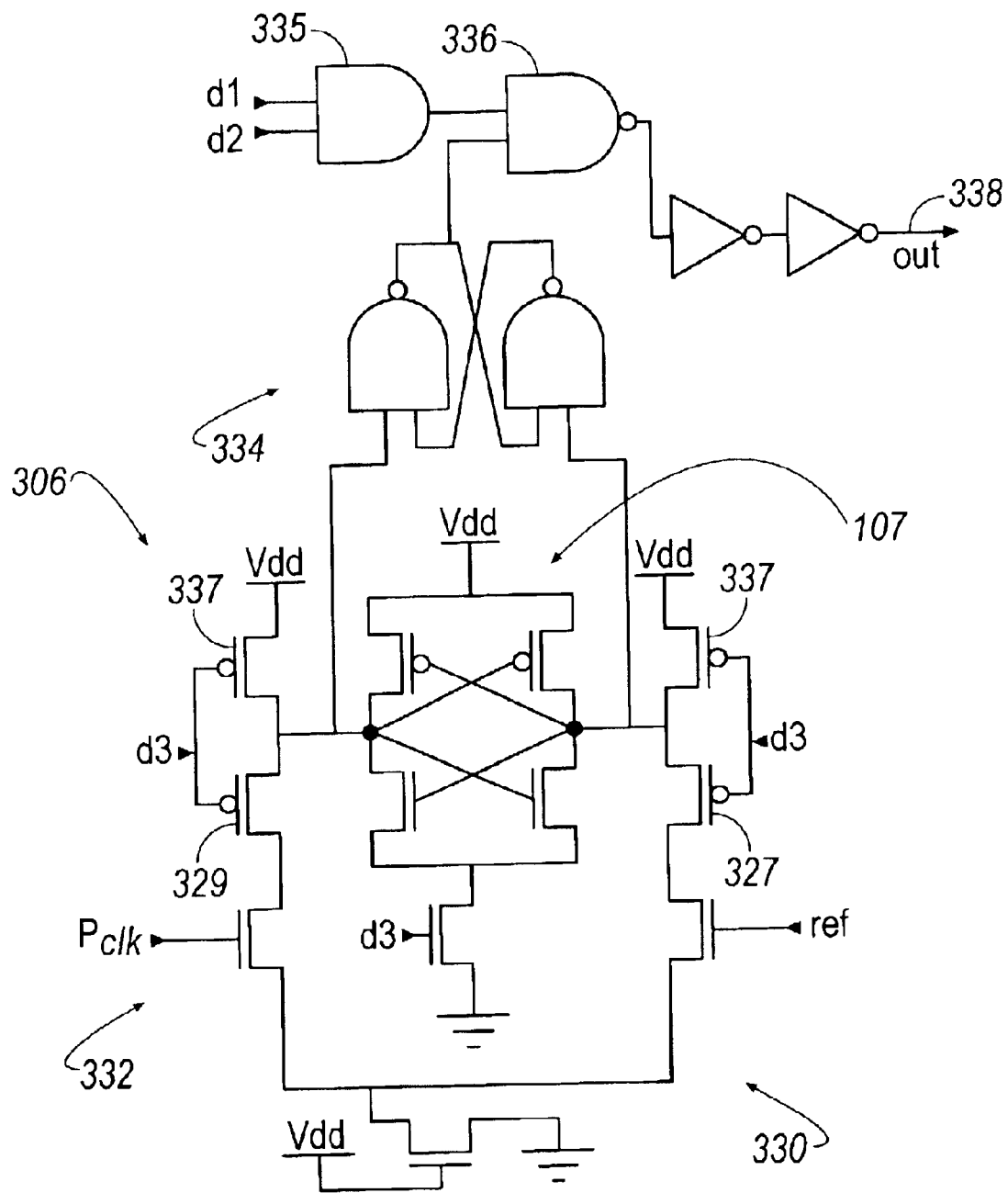
FIG. 5 is a schematic view of a clock generator circuit according to an embodiment of the invention.

Referring now to FIG. 5, cycle controller 306 is described in greater detail. In FIG. 5, cycle controller 306 generally includes reference branch 330 and Pclk branch 332. Delay d3 operates the gates of PMOS transistors 337 to amplify the Pclk and reference voltage ref entered into transistors 329 and 327 respectively at a time dictated by delay d3. The reference voltage ref, different from the reference clock, is a set DC voltage supplied to the cycle controller 306 from which to base the decision of whether oscillator portion 302 needs to be replenished or not. The difference between the peak Pclk voltage and the reference voltage is amplified by transistors 329 and 327. Cross coupled inverters 107 compare the peak Pclk voltage and the reference voltage. Transistors 337 isolate the result of the comparison from the amplifier transistors 329 and 327. Latch circuit 334, comprising cross coupled NAND gates, latches the comparison result between Pclk and ref and feeds it to NAND gate 336. If Pclk is less than ref, then the latched output from latch comparison circuit 334 drives NAND gate 336 with a sufficient ON voltage.

Additionally, d1 and d2 provide required delay times to ensure that output 338 is turned ON in proper timing sequence with the clock frequency of the circuit. The difference in delay signals, d1–d2, controls the ON time of switch 320. The sum of d1, d2 plus intrinsic delay in the system equals d3. By combining d1 and d2 to create one delay feeding the system, greater accuracy is achieved in the delay. These delays are externally settable, and can be adjusted for the application. As such, when the combined effect of d1 and d2 peak, the NAND gate 335 outputs a voltage, providing an input to NAND gate 336. NAND gate 336, in turn, is turned ON when this input is provided at the same time that latch comparison circuit 334 provides an input, thereby turning the output 338 ON.

While the present invention has been particularly shown and described with reference to the foregoing preferred and alternative embodiments, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and apparatus within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A flip-flop, comprising:
   an input value that provides a logic voltage indicating a logic state of the flip-flop;
   at least a first transistor connected to a clock signal generating circuit at a source or drain of the first transistor;
   at least a second transistor connected to a clock signal generating circuit at a source or drain of the second transistor;
   the clock signal generated by the clock signal generating circuit that is ramped or sinusoidal; and
   a latching circuit that latches a latch voltage value based on a first clock voltage at a first connection point and a second connection point, wherein the latch voltage is representative of the input value;
   wherein the first connection point is a source or drain of the first transistor that is opposite to the clock signal generating circuit; and
   wherein the second connection point is a source or drain of the second transistor that is opposite the clock signal generating circuit.

2. The flip-flop according to claim 1, wherein the latching circuit is a pair of cross coupled NOR gates that forms a set/reset latch.

3. The flip-flop according to claim 1, further comprising:
   a third transistor having a source or drain connected to the first connection point, wherein the third transistor has a third gate for setting the third transistor in an ON/OFF condition; and
   a fourth transistor having a source or drain connected to the second connection point, wherein the fourth transistor has a fourth gate for setting the fourth transistor in an ON/OFF condition;
   wherein the input value is connected to the third gate and the fourth gate to set the third gate and the fourth gate in opposite ON/OFF conditions representative of the input value.

4. The flip-flop according to claim 3, further comprising an inverter positioned between the input value and the fourth gate to invert the input value supplied to the fourth gate to set the fourth gate in the opposite ON/OFF condition from the third gate.

5. The flip-flop according to claim 3, wherein the source of the first transistor and the source of the second transistor are connected to the clock signal generator.

6. The flip-flop according to claim 5, wherein the drain of the third transistor and the drain of the fourth transistor are connected to ground.

7. The flip-flop according to claim 6, wherein the third transistor and the fourth transistor are NMOS transistors.

8. The flip-flop according to claim 7, wherein the first transistor and the second transistor are PMOS transistors.

9. The flip-flop according to claim 8, wherein:
the first transistor has a gate connected to the second connection point; and
the second transistor has a gate connected to the first connection point.

10. The flip-flop according to claim 3, wherein the drain of the first transistor and the drain of the second transistor are connected to the clock signal generator.

11. The flip-flop according to claim 10, wherein the source of the third transistor and the source of the fourth transistor are connected to a voltage source.

12. The flip-flop according to claim 11, wherein the third transistor and the fourth transistor are PMOS transistors.

13. The flip-flop according to claim 12, wherein the first transistor and the second transistor are NMOS transistors.

14. The flip-flop according to claim 13, wherein:
the first transistor has a gate connected to the second connection point; and
the second transistor has a gate connected to the first connection point.

15. The flip-flop according to claim 1, wherein the clock signal is a sinusoidal clock signal.

16. The flip-flop according to claim 15, further comprising the clock signal generating circuit.

17. The flip-flop according to claim 16, wherein said clock signal generating circuit includes a capacitor-inductor network for supplying the clock signal and recovering energy from the flip-flop.

18. A method for operating a low-power flip-flop with a single input clock signal of ramped or sinusoidal shape, comprising:
setting a first transistor and a second transistor of a flip-flop in an ON/OFF condition representative of an input value to the flip-flop that represents a logic state of the flip-flop;
driving sources or drains of the first transistor and the second transistor with a ramped or sinusoidal clock signal; and
latching voltages at sources or drains opposite to that which is being driven by the clock signal to latch the logic state of the flip-flop.

19. The method according to claim 18, wherein the step of driving the sources or drains of the first transistor and the second transistor is performed with a sinusoidal clock signal.

20. The method according to claim 18, further comprising the step of:
generating the clock signal with a clock signal generator.

21. The method according to claim 20, further comprising the step of recovering clock signal energy from the flip-flop by the clock signal generator.

22. The method according to claim 21, wherein the step of recovering is performed by passing the clock signal energy through one of the first transistor or the second transistor.

23. The method according to claim 22, wherein the clock signal energy is recovered by the clock signal generator.

24. The flip-flop according to claim 1, wherein the latching circuit is a pair of cross coupled NAND gates that forms a set/reset latch.

* * * * *